March 28, 1967 L. M. FOPPES 3,311,752

SQUARE WAVE GENERATOR CIRCUIT

Filed Dec. 27, 1963

INVENTOR.
LUKAS M. FOPPES
BY
Brown, Schuyler and Beveridge
ATTORNEYS 3,311,752

SQUARE WAVE GENERATOR CIRCUIT

Lukas M. Foppes, Mountain Lakes, N.J., assignor to Aircraft Radio Corporation, Boonton, N.J., a corporation of New Jersey Filed Dec. 27, 1963, Ser. No. 333,848
8 Claims. (Cl. 307—88.5)

The present invention relates to a triggered pulse generator circuit and more particularly to a circuit for converting a trigger pulse into a square wave pulse. The primary object of this invention is to provide an improved triggered square wave generator circuit.

A further object of this invention is to provide an improved square wave generator circuit in which the time duration of the generated square wave pulse is determined by a passive timing element.

According to the present invention, the square wave generator circuit includes a pulse amplifier and a gated regenerative feedback circuit for the pulse amplifier which is effective when a trigger pulse is applied to the input of the pulse amplifier to apply an increasing positive feedback to the input to the amplifier to rapidly drive the amplifier to full conduction. The trigger pulse applied to the pulse amplifier is applied through a delay circuit to an unlock gate circuit which opens the regenerative feedback circuit to discontinue its operation and operation of the pulse amplifier. An impedance matching circuit may couple the output of the pulse amplifier to the output terminals of the circuit.

In particular, the invention features a transistor amplifier in which the input and the output circuits thereof are regeneratively coupled by a lockup transistor amplifier which rapidly drives the pulse amplifier to full conduction. The lockup transistor amplifier has its emitter circuit controlled by an unlock transistor controlled by the input trigger pulse after a delay by a delay line. Thus, the circuit is turned on and off by the input pulse: in the first instance by the energization of the feedback circuit, and in the second instance by the opening and deactivation of the feedback circuit by the delayed pulse. An emitter follower transistor couples the generated square wave pulse to the output terminals.

The foregoing and other objects, advantages and features of the invention will become more apparent when considered in light of the specification and drawings wherein.

Figure 1:
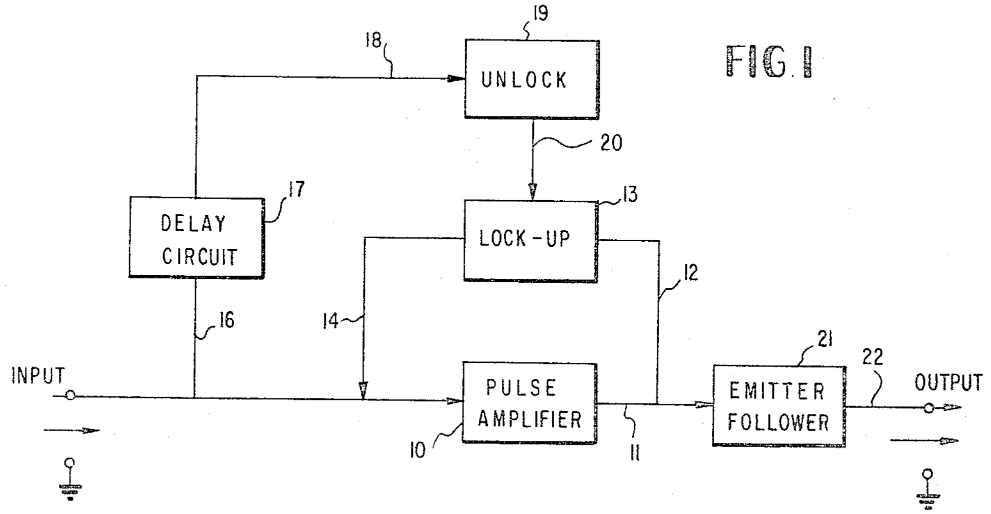
FIG. 1 is a block diagram of a circuit incorporating the invention.

As will appear more fully hereinafter, the essence of the present invention is the utilization of a discontinuous or gated regenerative feedback circuit which locks a pulse amplifier into full conduction and a circuit for controlling the regenerative feedback circuit to unlock it after a time delay. With reference to FIG. 1, which illustrates a circuit embodying a preferred form of the invention, a pulse applied to the input terminals X and Y is applied to the input of a pulse amplifier 10. Amplified pulses from the pulse amplifier on line 11 are applied through line 12 to the input of a "lockup" or gated regenerative feedback or lockup circuit 13 which controls pulse amplifier 10 through line 14 to rapidly drive the pulse amplifier to full conduction. At the same time that a pulse is applied to the input of pulse amplifier 10, line 16 carries the pulse through a delay circuit 17, which may be a conventional delay line. This delayed pulse from the delay circuit 17 is applied, which, through a line 18 to unlock circuit 19 through line 20, opens the lockup circuit 13 to open the regenerative feedback circuit and discontinue conduction of pulse amplifier 10. Thus, the output of pulse amplifier 10 is an output pulse coupled by emitter follower circuit 21 to output line 22, the duration of the output pulse being determined by the time delay circuit 17. The regenerative feedback through lockup circuit 13 rapidly drives the pulse amplifier 10 to full conduction. The opening of the lockup circuit 13 by the unlock circuit 19 causes the pulse amplifier 10 to cease conduction almost immediately. Thus, the delay circuit 17 determines the occurrence of the trailing edge of the square wave pulse at precise intervals of time. On the other hand, the leading edge of the square wave pulse at the output line 22 is determined by the speed at which lockup circuit 13 operates to drive pulse amplifier 10 to full conduction.

Figure 2:
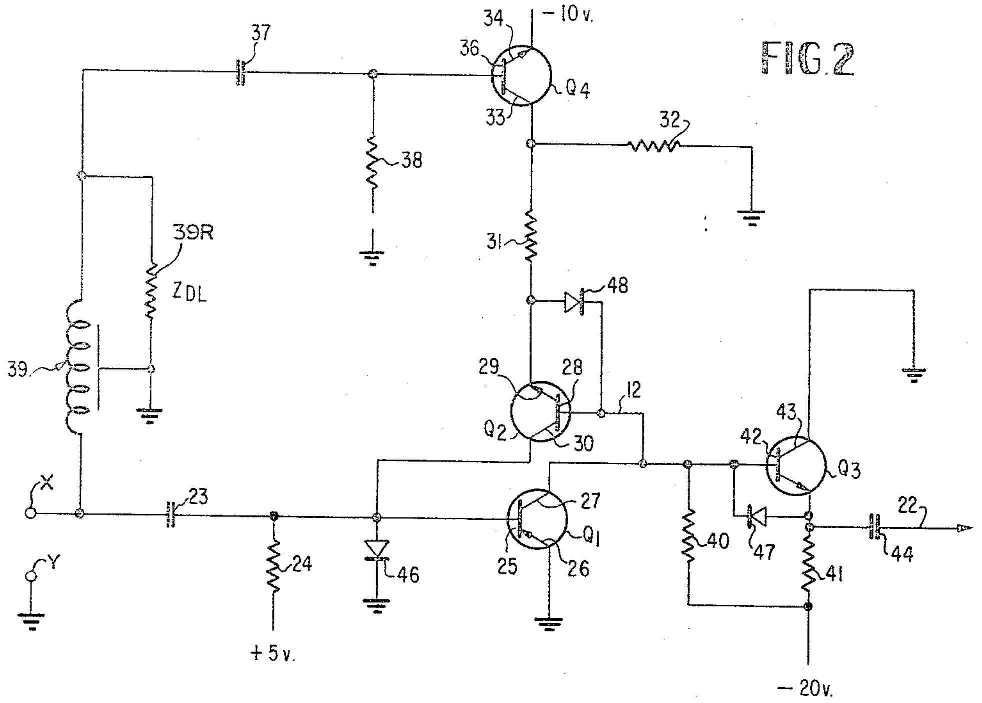
FIG. 2 is a circuit diagram of a square wave pulse generator employing the invention.

Referring now to the schematic diagram of FIG. 2, the pulse applied to terminal X is coupled through a capacitor 23 and resistor 24 to the base 25 of transistor $Q_1$. The emitter 26 of transistor $Q_1$ is tied directly to ground while the collector 27 is biased with operating potential from a negative terminal through its collector load resistor 40.

Collector 27 of transistor $Q_1$ is tied directly to the base 28 of transistor $Q_2$. Collector 30 of transistor $Q_2$ is directly connected to the base 25 of transistor $Q_1$ and the emitter 29 of transistor $Q_2$ is coupled through load resistor 31 to the collector 33 of transistor $Q_4$. Resistor 32 shares as the load resistor for the collector 33 of transistor $Q_4$ and is tied between the collector 33 and ground. Emitter 34 of transistor $Q_4$ is tied to a −10 volt supply.

A pulse supplied to the terminal X is coupled through delay line 39, which is terminated in its characteristic impedance ZDL by resistor 39R, to apply the input pulse, delayed by a predetermined interval, to coupling capacitor 37 and resistor 38 to the base 36 of transistor $Q_4$.

In the exemplary circuit illustrated in FIG. 2, transistor $Q_1$ is biased so that a negative trigger pulse is required to turn transistor $Q_1$ on. Transistor $Q_4$ is normally conducting so that its collector 33 is at the negative potential applied to the emitter.

A negative trigger pulse applied to the base 25 of transistor $Q_1$ turns transistor $Q_1$ fully on by overcoming the back bias applied to the base 25 thereof through resistor 24. The transistor $Q_1$ begins to conduct. When the collector 27 of transistor $Q_1$ goes beyond the negative voltage on the emitter 29 of transistor $Q_2$, transistor $Q_2$ turns on to supply regenerative base current to transistor $Q_1$ to make transistor $Q_1$ conduct more heavily towards saturation. Resistor 31 must be such that the minimum base current is supplied to transistor $Q_1$ to sustain full conduction. Transistor $Q_1$'s speed in turning on will determine the minimum trigger pulse width assuming the speed of transistor $Q_1$ is as fast or faster than the trigger pulse or the speed of transistor $Q_2$.

The collector 27 of transistor $Q_1$ is connected directly to the base 42 of emitter follower transistor $Q_3$ and the collector 43 thereof is tied directly to ground. The emitter resistor 41 couples the emitter of transistor $Q_3$ to the −20 volt supply. Pulses appearing on the collector 27 of transistor $Q_1$ appear across the emitter resistor 41 and are coupled therefrom by coupling capacitor 44 to the output line 22.

After the delay time offered by delay line 39, the trigger pulse is passed by the delay line to base 36 of transistor $Q_4$ to cause this transistor to turn off. Turning off of transistor $Q_4$ interrupts the supply of regenerative feedback current via resistor 31 at the emitter 29–collector 30 circuit of feedback transistor $Q_2$ to thus interrupt the feedback current to base 25 of transistor $Q_1$ to allow transistor $Q_1$ to return to a quiescent state. Thus, transistor $Q_1$ will turn off and transistor $Q_2$ will turn off setting the circuit back into condition for the generation of another pulse. The diodes 46, 47 and 48 between the base-emitter circuits of transistors $Q_1$, $Q_3$ and $Q_2$, respectively, clamp these circuits so that the maximum triggering rate and operation of the circuit are substantially unaffected by minority carrier storage effects.

It will be appreciated that the circuit may be used where high pulse repetition rates are required, as for example, in the use of modulators, etc. The invention avoids the problem of recovery time of timing capacitors, etc. and at the same time utilizes a delay line as a stable timing element.

While the invention has been described with reference to an exemplary embodiment, it will be understood that other equivalent structures are intended to be included within the spirit and scope of the appended claims.

What is claimed is:

1. A triggered pulse generator circuit comprising in combination, a source of trigger pulses, a transistor amplifier having input and output terminals, a regenerative feedback circuit connected between the input and output terminals of said transistor amplifier for driving said transistor amplifier to saturation on application of a trigger pulse thereto from said source, said regenerative feedback circuit including a second transistor having an input base electrode, emitter electrode and an output collector electrode, said input base electrode being connected to the output terminal of said first transistor amplifier and said output collector electrode connected to said input terminal of said transistor amplifier, time delay circuit means connected to said source of trigger pulses for delaying trigger pulses from said source a predetermined time interval, means between said time delay circuit and the emitter electrode of said second transistor to control current to said emitter electrode to disable said regenerative feedback circuit at said predetermined time interval after the application of the trigger pulse to the input terminal of said transistor amplifier.

2. The circuit defined in claim 1 wherein said means between said time delay circuit and said regenerative feedback circuit is an electronic switch operative on application of a pulse from said delay circuit thereto to disable said regenerative feedback circuit.

3. The circuit as defined in claim 2 wherein said electronic switch is a transistor having base, collector and emitter electrodes with the emitter-collector circuit in series with a source of regenerative current through the emitter electrode of said second transistor to the input terminal of said first transistor, and wherein said delay circuit applies a delayed trigger pulse to the base of said transistor switch to control same and the flow of regenerative current through said second transistor to the input terminal of said first transistor.

4. In an amplifier having a regenerative feedback circuit between the input and output terminals thereof driving the amplifier to full conduction on the application of a trigger pulse to the input terminals thereof, the improvement which comprises means for disabling said regenerative feedback circuit to discontinue conduction of said amplifier a predetermined time interval after the application of the trigger pulse to the input thereof, said means for disabling including a delay line, means for applying the trigger pulse to the delay line substantially simultaneously with the full conduction of said amplifier, said feedback circuit including a transistor having base, collector and emitter electrodes, means connecting the base electrode of the transistor to the output of said amplifier, means connecting the collector electrode of said transistor to the input circuit of said amplifier, and means for controlling the emitter electrode of said transistor with the trigger pulses issuing from said delay line.

5. The amplifier as defined in claim 4 wherein the last named means comprises a transistor gate connecting the emitter of the feedback transistor to a source of current, and means for controlling said transistor gate with the trigger pulses from said delay line.

6. A triggered, square wave generator comprising a source of trigger pulses, a first transistor having base, collector and emitter electrodes supplied with biasing currents rendering the transistor normally nonconductive, a second transistor having base, collector and emitter electrodes with the base and collector electrodes thereof being connected directly to the collector and base electrodes, respectively, of said first transistor, so that the output collector electrode of said first transistor is regeneratively coupled to the input base electrode thereof, a third transistor having base, collector and emitter electrodes, a regenerative current supply for the input base electrode of said first transistor, means connecting said regenerative current supply to said input base electrode through a series circuit including the collector and emitter circuits of said second and third transistors, a delay line, means coupling said delay line between said source of trigger pulses and the base electrode of said third transistor to control the supply of regenerative current through said series circuit to said input base electrode.

7. The circuit defined in claim 6 wherein said series circuit includes a current limiting resistance between the collector-emitter circuit of the said second transistor and the collector-emitter circuit of said third transistor.

8. The circuit defined in claim 7 wherein said first transistor is of one conductivity type and said second and said third transistor are of opposite conductivity types than said first transistor.

References Cited by the Examiner

UNITED STATES PATENTS

| | | | |
|---|---|---|---|
| 3,071,732 | 1/1963 | Martin et al. | 307—88.5 |
| 3,091,705 | 5/1963 | Levine | 307—88.5 |
| 3,106,684 | 10/1963 | Luik | 307—88.5 |
| 3,231,765 | 1/1966 | Martin et al. | 307—88.5 |

ARTHUR GAUSS, *Primary Examiner.*

S. D. MILLER, *Assistant Examiner.*